US012007555B2

(12) United States Patent
Jin et al.

(10) Patent No.: US 12,007,555 B2
(45) Date of Patent: Jun. 11, 2024

(54) MEMS DEVICE WITH A DUAL HINGE STRUCTURE

(71) Applicant: Lumentum Operations LLC, San Jose, CA (US)

(72) Inventors: Wenlin Jin, Ottawa (CA); Maziar Moradi, Ottawa (CA); Gonzalo Wills, Ottawa (CA); Stephen Bagnald, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 932 days.

(21) Appl. No.: 16/948,051

(22) Filed: Aug. 28, 2020

(65) Prior Publication Data

US 2021/0396993 A1    Dec. 23, 2021

Related U.S. Application Data

(60) Provisional application No. 63/040,646, filed on Jun. 18, 2020.

(51) Int. Cl.
*G02B 26/08* (2006.01)
*B81B 3/00* (2006.01)
(Continued)

(52) U.S. Cl.
CPC ........ *G02B 26/0841* (2013.01); *B81B 3/0045* (2013.01); *G01S 7/4817* (2013.01); *H02N 1/008* (2013.01); *B81B 2201/033* (2013.01); *B81B 2201/042* (2013.01); *B81B 2203/0154* (2013.01); *B81B 2203/0307* (2013.01)

(58) Field of Classification Search
CPC .......... B81B 2203/0154; B81B 3/0045; B81B 3/0035; B81B 3/004; B81B 3/0048; B81B 3/0051; B81B 3/0059; B81B 2201/033; B81B 2201/042; B81B 2201/04; B81B 2203/0307; B81B 2203/0145; G02B 26/0841; G02B 26/0833; G02B 26/0825; (Continued)

(56) References Cited

U.S. PATENT DOCUMENTS

7,046,421 B1 *   5/2006   Fu ...................... G02B 26/0841
                                                          359/290
7,538,927 B1 *   5/2009   Fu ...................... G02B 26/0841
                                                          216/2
(Continued)

*Primary Examiner* — Derek S. Chapel
*Assistant Examiner* — Adam W Booher
(74) *Attorney, Agent, or Firm* — Harrity & Harrity, LLP (57) ABSTRACT

A micro-electro-mechanical system (MEMS) device may comprise a first layer that includes a stator comb actuator; a second layer that includes a rotor comb actuator; a mirror structure that includes a mirror; and a first set of hinges and a second set of hinges configured to tilt the mirror structure about a first axis of the MEMS device based on a driving torque caused by the stator comb actuator engaging with the rotor comb actuator. The first set of hinges may be configured to resist a lateral linear force on the mirror structure in a direction associated with the first axis caused by the stator comb actuator engaging with the rotor comb actuator. The second set of hinges may be configured to resist an in-plane torque on the mirror structure about a second axis of the MEMS device caused by the stator comb actuator engaging with the rotor comb actuator.

20 Claims, 3 Drawing Sheets

(51) Int. Cl.
*G01S 7/481* (2006.01)
*H02N 1/00* (2006.01)

(58) Field of Classification Search
CPC . G01S 7/4817; H02N 1/008; H02N 1/00–006
See application file for complete search history.

(56) References Cited

U.S. PATENT DOCUMENTS

| | | | |
|---|---|---|---|
| 9,201,239 B1* | 12/2015 | Fu | G02B 26/0841 |
| 2005/0200986 A1* | 9/2005 | Tsuboi | G02B 26/0841 |
| | | | 359/871 |
| 2011/0188104 A1* | 8/2011 | Tachibana | G02B 26/0841 |
| | | | 310/309 |

* cited by examiner

MEMS DEVICE WITH A DUAL HINGE STRUCTURE

RELATED APPLICATION(S)

This application claims priority to U.S. Provisional Patent Application No. 63/040,646, filed on Jun. 18, 2020, and entitled "MEMS DEVICE WITH A DUAL HINGE STRUCTURE TO RESIST UNWANTED MEMS DEVICE MOVEMENT," the content of which is incorporated by reference herein in its entirety.

TECHNICAL FIELD

The present disclosure relates to a micro-electro-mechanical system (MEMS) device that includes a first set of hinges and a second set of hinges to tilt a mirror structure of the MEMS device about an axis, and to a MEMS device that includes a first set of hinges and a second set of hinges to tilt a mirror structure of the MEMS device about an axis and to resist unwanted lateral linear force and/or unwanted in-plane torque on the mirror structure.

BACKGROUND

A MEMS device is a micro-sized mechanical structure that may include a mirror for reflecting light. When the MEMS device is actuated, the mirror may be tilted about an axis, which may cause an optical beam that was falling upon the mirror and reflecting in one direction to fall upon the mirror and reflect in a different direction.

SUMMARY

In some implementations, a MEMS device includes a first layer that includes a set of stator comb actuators; a second layer that includes a set of rotor comb actuators and a first set of hinges; and a third layer that includes a second set of hinges, wherein: the second layer is adjacent to the first layer and the third layer is adjacent to the second layer, the first set of hinges and the second set of hinges are configured to tilt a mirror structure about a first axis of the MEMS device, wherein a driving torque to tilt the mirror structure about the first axis of the MEMS device via the first set of hinges and the second set of hinges is caused by a stator comb actuator, of the set of stator comb actuators, engaging with a rotor comb actuator, of the set of rotor comb actuators, the first set of hinges is configured to resist a lateral linear force on the mirror structure in a direction associated with the first axis caused by the stator comb actuator engaging with the rotor comb actuator, and the second set of hinges is configured to resist an in-plane torque on the mirror structure about a second axis of the MEMS device caused by the stator comb actuator engaging with the rotor comb actuator.

In some implementations, a MEMS device includes a first layer that includes a set of stator comb actuators; and a second layer that includes a set of rotor comb actuators, a first set of hinges, and a second set of hinges, wherein: the second layer is adjacent to the first layer, the first set of hinges and the second set of hinges are configured to tilt a mirror structure about a first axis of the MEMS device based on a driving torque caused by a stator comb actuator, of the set of stator comb actuators, engaging with a rotor comb actuator, of the set of rotor comb actuators, the first set of hinges is configured to resist a lateral linear force on the mirror structure in a direction associated with the first axis caused by the stator comb actuator engaging with the rotor comb actuator, and the second set of hinges is configured to resist an in-plane torque on the mirror structure about a second axis of the MEMS device caused by the stator comb actuator engaging with the rotor comb actuator.

In some implementations, a MEMS device includes a first layer that includes a stator comb actuator; a second layer that includes a rotor comb actuator; a mirror structure that includes a mirror; and a first set of hinges and a second set of hinges configured to tilt the mirror structure about a first axis of the MEMS device based on a driving torque caused by the stator comb actuator engaging with the rotor comb actuator, wherein: the first set of hinges is configured to resist a lateral linear force on the mirror structure in a direction associated with the first axis caused by the stator comb actuator engaging with the rotor comb actuator, and the second set of hinges is configured to resist an in-plane torque on the mirror structure about a second axis of the MEMS device caused by the stator comb actuator engaging with the rotor comb actuator.

DETAILED DESCRIPTION

The following detailed description of example implementations refers to the accompanying drawings. The same reference numbers in different drawings may identify the same or similar elements.

A light detection and ranging (LIDAR) system detects an object by illuminating the object with an optical beam (e.g., a laser beam) and measuring characteristics of a reflected optical beam. A vehicle, such as a semiautonomous or fully autonomous vehicle, may use a LIDAR system to detect objects (e.g., other vehicles, pedestrians, road debris, and/or the like) in a path of the vehicle. A typical LIDAR system includes a beam deflection unit that deflects both projected optical beams and reflected optical beams. However, the beam deflection unit spins in place and is therefore subject to mechanical wear and tear (e.g., from friction, abrasion, and/or the like). Accordingly, for many applications, such as autonomous vehicle applications, a more robust solid-state LIDAR system is desired.

In some cases, a solid-state LIDAR system may use one or more MEMS devices to deflect projected optical beams and reflected optical beams. For such a LIDAR system to provide a long range and wide field-of-view, a MEMS device of the LIDAR system should include a large mirror that can provide wide deflection angles. Moreover, the MEMS device needs to have a high resonant frequency to be resistant to operational vibrations (e.g., that result from operation of a vehicle that includes the LIDAR system). For example, a vehicle may be subject to vibrations created by the vehicle travelling on a road, airflow, and/or the like that propagate to a MEMS device of a LIDAR system included in the vehicle.

In many cases, the MEMS device uses a multi-layer comb actuator structure (e.g., comprising a stator comb actuator and a rotor comb actuator) to provide a driving torque to tilt the mirror on a hinge of the MEMS device about an axis. To provide enough driving torque to tilt the mirror and/or to maintain a deflection angle of the mirror when the MEMS device is subject to operation vibrations, a gap between teeth of the stator comb actuator and teeth of the rotor comb actuator may be reduced across the comb actuator structure. However, due to inherent complexities associated with fabricating the stator comb actuator and the rotor comb actuator, the gap between the teeth of the stator comb actuator and the teeth of the rotor comb actuator may be nonuniform and/or misaligned across the comb actuator structure. This may generate an unwanted lateral linear force on the mirror in a direction associated with the axis and/or an unwanted in-plane torque on the mirror around an additional axis. This reduces a likelihood that the mirror will tilt to and/or maintain the deflection angle, which inhibits the functionality of the MEMS device and/or the solid-state LIDAR system. Additionally, the hinge may have a pivot point that is not aligned with a mass center of the mirror, which may allow operational vibrations to produce competing lateral linear force and/or torque that causes the mirror to tilt away from a preferred deflection angle and that further inhibits the functionality of the MEMS device and/or the solid-state LIDAR system.

Some implementations described herein provide a MEMS device with a multi-layer comb actuator structure to provide driving torque to tilt a mirror structure about a first axis of the MEMS device. The MEMS device may include a first set of hinges (e.g., twisting hinges, such as bar hinges) and a second set of hinges (e.g., twisting hinges, such as serpentine hinges) configured to tilt the mirror structure about the first axis when the driving torque is provided by the comb actuator structure. The first set of hinges may be configured to resist an unwanted lateral linear force on the mirror structure in a direction associated with the first axis that is generated by the comb actuator structure providing the driving torque (e.g., due to misalignment of teeth of the comb actuator structure). The second set of hinges may be configured to resist an in-plane torque on the mirror structure about a second axis of the MEMS device that is generated by the comb actuator structure providing the driving torque (e.g., due to the misalignment of teeth of the comb actuator structure). This increases a likelihood that the mirror structure will tilt to and/or maintain a preferred deflection angle, even when teeth of the comb actuator structure are misaligned.

Further, in some implementations, the first set of hinges and the second set of hinges may be designed to have a pivot center that is aligned with a mass center of the mirror structure. This reduces or removes vibration induced lateral linear force and/or torque that may affect the preferred deflection angle of the mirror structure. Accordingly, some implementations described herein provide a MEMS device that is more resistant to operational vibrations than traditional MEMS devices, which facilitates more robust functionality of the MEMS device and/or a solid-state LIDAR system that includes the MEMS device.

Figure 1:
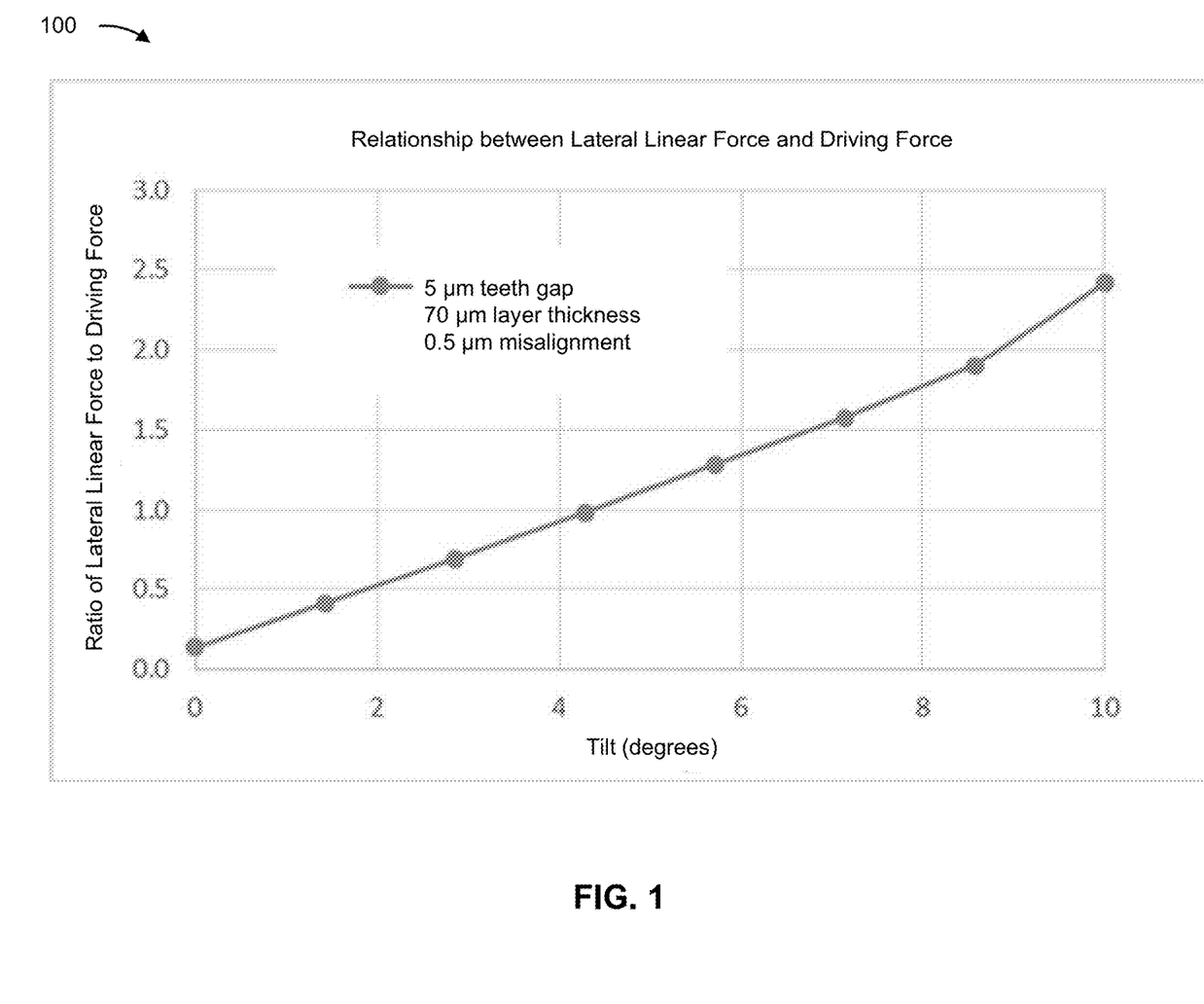
FIG. 1 is a diagram of a plot 100 illustrating a relationship between a lateral linear force generated by a conventional MEMS device described herein and a driving force generated by the conventional MEMS device.

FIG. 1 is a diagram of a plot 100 illustrating a relationship between a lateral linear force generated by a conventional MEMS device and a driving force generated by the conventional MEMS device. The conventional MEMS device includes a multi-layer comb actuator structure that generates the driving force to tilt a mirror on a set of hinges of the conventional MEMS device about an axis of the MEMS device. Moreover, due to a misalignment of teeth of the comb actuator structure, the multi-layer comb actuator generates the lateral linear force in a direction of the axis. As shown in FIG. 1, when a 0.5 micrometer (μm) misalignment exists between teeth of the comb actuator structure associated with a 5 μm gap, a ratio of the lateral linear force to the driving force increases as the tilt angle of the mirror (e.g., with a 70 μm thickness) increases. Accordingly, when the tilt angle of the mirror exceeds a threshold angle, the lateral linear force may cause the mirror to move in an unwanted direction (e.g., in the direction of the axis), which may negatively affect a performance of the mirror and/or the conventional MEMS device.

As indicated above, FIG. 1 is provided merely as one or more examples. Other examples may differ from what is described with regard to FIG. 1.

Figure 2:
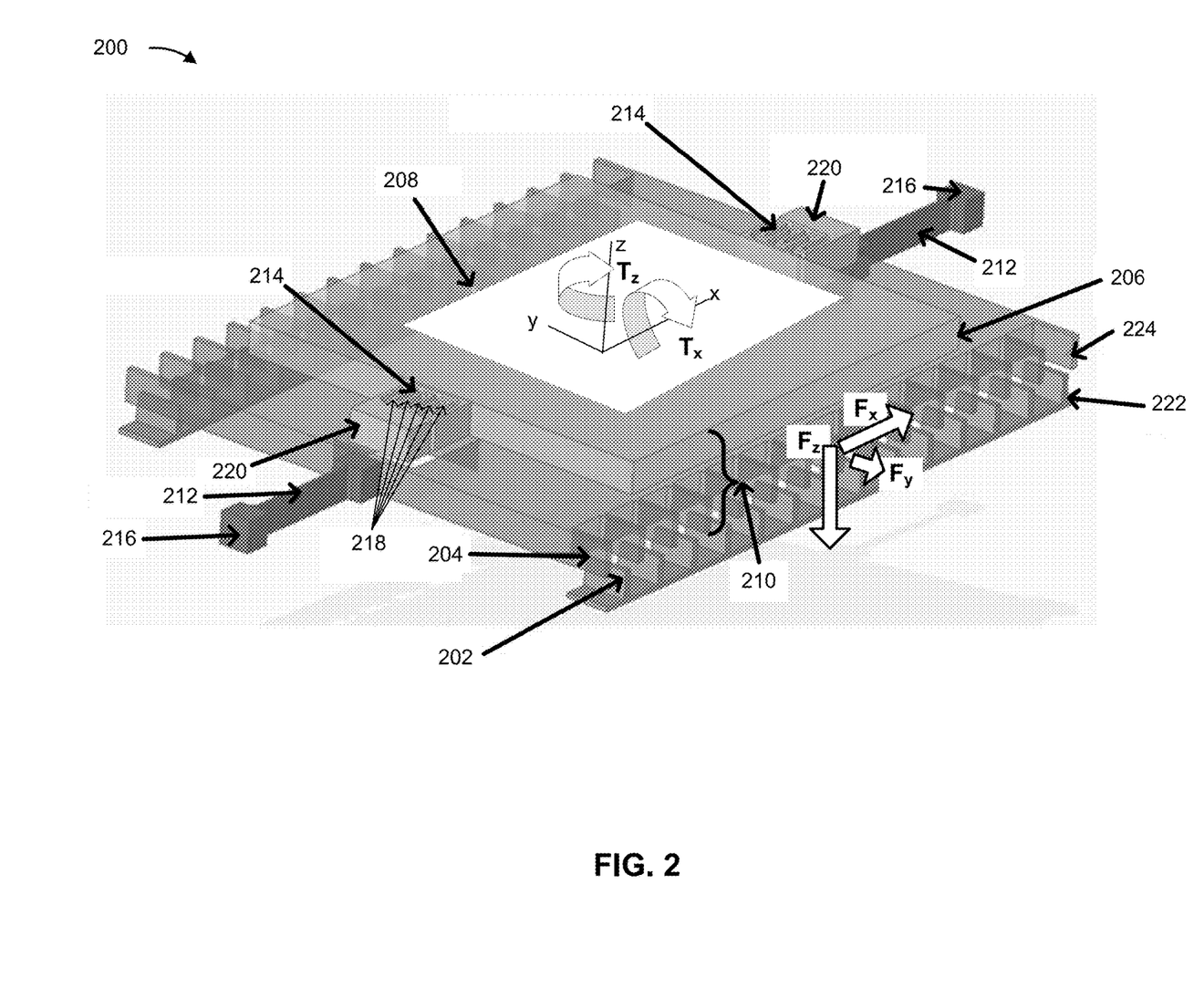
FIG. 2 is a diagram of a first example MEMS device described herein.

FIG. 2 is a diagram of an example MEMS device 200 described herein. The MEMS device 200 may be a micro-sized optical device configured to deflect optical beams. As shown in FIG. 2, the MEMS device 200 may include a first layer 202, a second layer 204, and/or a third layer 206. The first layer 202 may comprise a substrate of the MEMS device 200. In some implementations, the second layer 204 and/or the third layer 206 may be adjacent to the first layer 202 (e.g., formed in layers on the substrate, grown in layers on the substrate, deposited in layers on the substrate, and/or the like). The first layer 202, the second layer 204, and/or the third layer 206 may be silicon-based layers (e.g., with equal thickness, such as 70 μm).

The third layer 206 may include a mirror 208. The mirror 208 may form some or all of the third layer 206 (e.g., the third layer 206 may be shaped, etched, formed, and/or the like to create the mirror 208). The mirror 208 may be coated with a reflective coating (e.g., a metallic reflective material, such as gold) for reflecting optical beams.

In some implementations, a mirror structure 210 may be composed of multiple layers, such as the second layer 204, the third layer 206, and/or the mirror 208 (e.g., the mirror structure 210 may include some or all of the second layer 204, the third layer 206, and/or the mirror 208). For example, the mirror structure 210 may include the mirror 208; one or more portions of the first layer 202 that does not include a first set of hinges 212, described herein; and/or one or more portions of the second layer 204 that does not include a second set of hinges 214, described herein.

The mirror structure 210 may be suspended (over the first layer 202) via a first set of hinges 212 (e.g., comprising two or more hinges of a first type) and/or a second set of hinges 214 (e.g., comprising two or more hinges of a second type) of the MEMS device 200. The first set of hinges 212 and/or the second set of hinges 214 (e.g., independently and/or in combination) may be configured to tilt the mirror structure 210 (or to allow the mirror structure 210 to tilt) about a first axis (e.g., the x-axis shown in FIG. 2) of the MEMS device 200. For example, the first set of hinges 212 and/or the second set of hinges 214 may be aligned along the first axis of the MEMS device 200 to allow the mirror structure 210 to tilt about the first axis.

In some implementations, the first set of hinges 212 may be included as part of the second layer 204. In some implementations, the first set of hinges 212 may be mounted to the first layer 202 via one or more respective anchors 216. Each anchor 216, of the one or more anchors 216, may be included as part of the second layer 204. The one or more anchors 216 may be configured to stabilize the mirror structure 210 as the mirror structure 210 tilts on the first set of hinges 212 about the first axis (e.g., about the x-axis shown in FIG. 2).

In some implementations, the second set of hinges 214 may be included as part of the third layer 206. In some implementations, the second set of hinges 214 may be mounted to the first layer 202 via one or more respective anchors 220. Each anchor 220, of the one or more anchors 220, may be included as part of the second layer 204 and/or the third layer 206. The one or more anchors 220 may be configured to stabilize the mirror structure 210 as the mirror structure 210 tilts on the second set of hinges 214 about the first axis (e.g., about the x-axis shown in FIG. 2).

In some implementations, the MEMS device 200 may include one or more comb actuator structures (e.g., a comb actuator structure on each side, in the positive and negative y-directions, of the MEMS device 200 as shown in FIG. 2). A comb actuator structure may be configured to generate an electrostatic torque (also referred to as a driving torque) to tilt the mirror structure 210 about the first axis (e.g., about the x-axis shown in FIG. 2) of the MEMS device 200 on the first set of hinges 212 and/or the second set of hinges 214. Moreover, the comb actuator structure may include one or more comb actuators, such as a stator comb actuator and/or a rotor comb actuator. For example, a comb actuator structure may include a stator comb actuator 222 and/or a rotor comb actuator 224. In some implementations, stator comb actuator 222 may form part of the first layer 202 and/or the rotor comb actuator 224 may form part of the second layer 204.

In some implementations, each of the one or more comb actuators may include a plurality of teeth for engaging with a plurality of teeth of another of the comb actuators. For example, the stator comb actuator 222 may include a plurality of teeth to engage with a plurality of teeth of the rotor comb actuator 224. When a voltage is applied to the stator comb actuator 222, a voltage difference between the rotor comb actuator 224 and the stator comb actuator 222 creates an electrostatic field that causes (e.g., pulls) the plurality of teeth of the rotor comb actuator 224 to engage with the plurality of teeth of the stator comb actuator 222. The electrostatic field may generate a linear electrostatic force (e.g., shown as $F_z$ in FIG. 2) in a direction associated with a second axis (e.g., the z-axis shown in FIG. 2) and/or electrostatic torque (e.g., shown as $T_x$ in FIG. 2) that causes the mirror structure 210 to tilt about the first axis (e.g., about x-axis shown in FIG. 2) on the first set of hinges 212 and/or the second set of hinges 214.

In some implementations, due to one or more misalignments between the plurality of teeth of the rotor comb actuator 224 and the plurality of teeth of the stator comb actuator 222, the electrostatic field may also generate unwanted linear electrostatic force (e.g., shown as $F_x$ in FIG. 2) on the mirror structure 210 in a direction associated with the first axis (e.g., the x-axis) (hereinafter referred to as a "first lateral linear force"). In some implementations, the first set of hinges 212 may include twisting hinges (e.g., two or more twisting hinges) configured to resist the first lateral linear force on the mirror structure 210. For example, as shown in FIG. 2, a hinge 212, of the first set of hinges 212, may be a bar hinge. When a length of a bar of the bar hinge satisfies (e.g., is greater than or equal to) a first bar-length threshold (e.g., that is associated with a particular amount of stiffness, rigidity, and/or the like), the bar hinge is configured to resist the first lateral linear force on the mirror structure 210 in the direction associated with the first axis. For example, the first lateral linear force may act as a compressive force on the bar of the bar hinge, which may be configured, due to the length of the bar being aligned with the first lateral linear force, to prevent the first lateral linear force from moving the mirror structure 210 in the direction associated with the first axis of the MEMS device 200 more than a threshold amount.

Additionally, or alternatively, due to the one or more misalignments between the plurality of teeth of the rotor comb actuator 224 and the plurality of teeth of the stator comb actuator 222, the electrostatic field may also generate unwanted linear electrostatic force (e.g., shown as $F_y$ in FIG. 2) on the mirror structure 210 in a direction associated with the third axis (e.g., the y-axis) (hereinafter referred to as a "second lateral linear force") and/or unwanted electrostatic torque (e.g., shown as $T_z$ in FIG. 2) on the mirror structure 210 about the second axis (e.g., about the z-axis shown in FIG. 2) (hereinafter referred to as "in-plane torque"). In some implementations, the second set of hinges 214 may include twisting hinges (e.g., two or more twisting hinges) configured to resist the second lateral linear force and/or the in-plane torque on the mirror structure 210.

For example, as shown in FIG. 2, a hinge 214, of the second set of hinges 214, may be a serpentine hinge that includes a plurality of bars 218 (e.g., a folded hinge with the plurality of bars 218 arranged side-by-side along a third axis of the MEMS device 200, such as the y-axis shown in FIG. 2). When a length of each bar 218 satisfies (e.g., is less than) a second bar-length (e.g., that is associated with a particular amount of stiffness, rigidity, and/or the like) threshold and/or a sum of the lengths of the plurality of bars 218 satisfies (e.g., is greater than or equal to) a third bar-length threshold (e.g., that is associated with a particular amount of stiffness, rigidity, and/or the like), the serpentine hinge is configured to resist the second lateral linear force on the mirror structure in the direction associated with the third axis and/or the in-plane torque on the mirror structure 210 about the second axis. For example, the second lateral linear force may act as a compressive force on the plurality of bars 218 of the serpentine hinge, which may be configured, due to short lengths of the plurality of bars 218 (e.g., because bending deformation under the second lateral linear force is inversely proportional to a cubic of bar length), to prevent the second lateral linear force from moving the mirror structure 210 in the direction associated with the third axis of the MEMS device 200 more than a threshold amount. As another example, the in-plane torque may act as a bending force on the plurality of bars 218 of the serpentine hinge, which may be configured, due to short lengths of the plurality of bars 218, to prevent the in-plane torque from tilting the mirror structure 210 about the second axis of the MEMS device 200 more than a threshold amount.

In some implementations, a pivot center (e.g., a representative pivot point) of the first set of hinges 212 and the second set of hinges 214 may be aligned with a mass center of the mirror structure 210. In some implementations, the pivot center may be a function of respective lateral stiffness associated with the first set of hinges 212 and the second set of hinges 214. For example, the pivot center may be based on a ratio of lateral stiffness associated with the first set of hinges 212 and lateral stiffness associated with the second set of hinges 214. The ratio may be adjusted to cause the pivot center to move (e.g., along the z-axis shown in FIG. 2) so that the pivot center is positioned at the mass center of the mirror structure 210. In this way, the mass center of the mirror structure 210 may be aligned with the pivot center of the first set of hinges 212 and the second set of hinges 214, which may increase an operational vibration resistance of the mirror structure 210, first set of hinges 212, and/or the second set of hinges 214. Accordingly the mirror structure 210 may resist linear inertial force caused by operational vibration and thereby prevent or reduce induced tilting torque.

As indicated above, FIG. 2 is provided merely as one or more examples. Other examples may differ from what is described with regard to FIG. 2.

Figure 3:
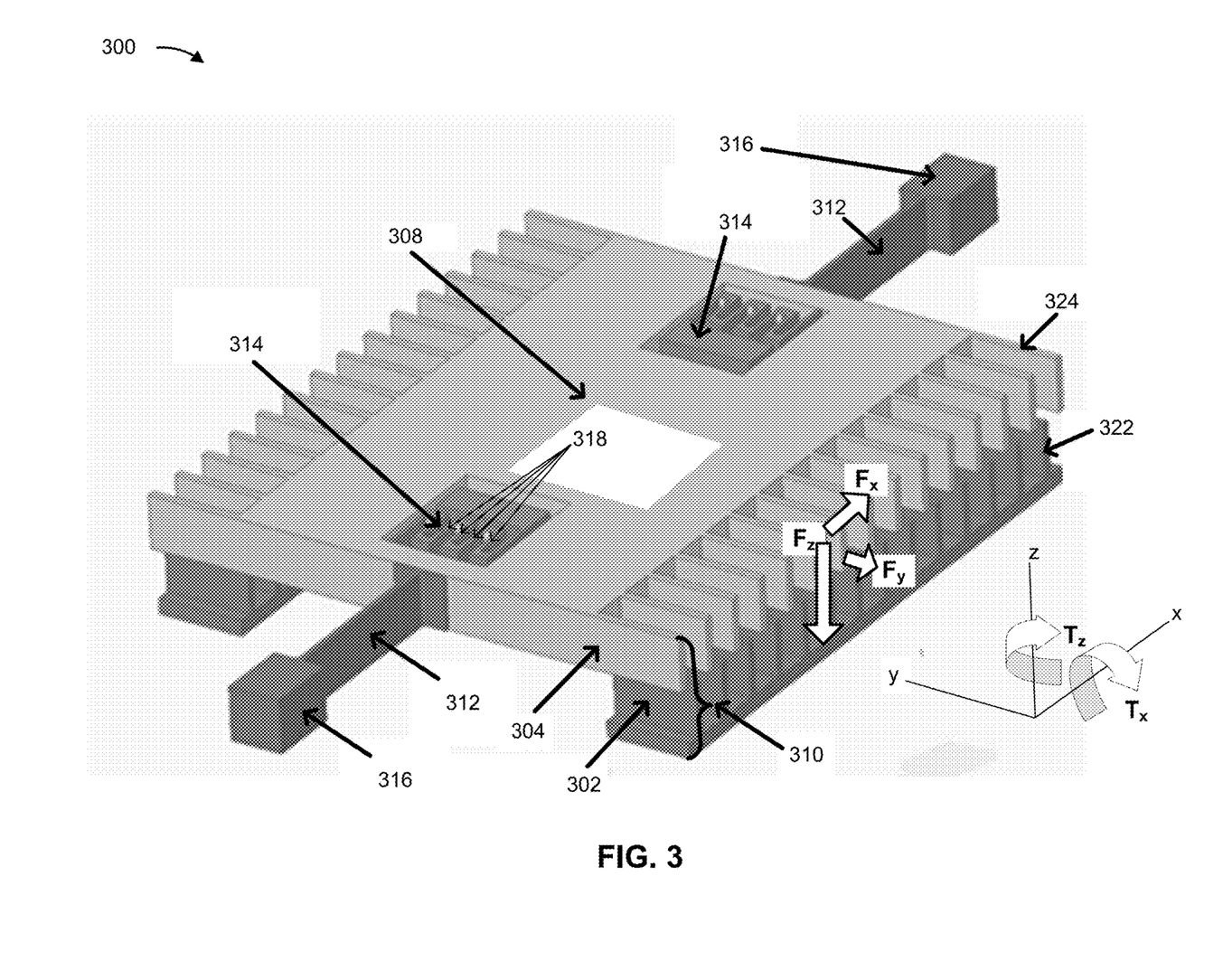
FIG. 3 is a diagram of a second example MEMS device described herein

FIG. 3 is a diagram of an example MEMS device 300 described herein. The MEMS device 300 may be a micro-sized optical device configured to deflect optical beams. As shown in FIG. 3, the MEMS device 300 may include a first layer 302 and/or a second layer 304. The first layer 302 may comprise a substrate of the MEMS device 300. In some implementations, the second layer 304 may be adjacent to the first layer 302 (e.g., formed in a layer on the substrate, grown in a layer on the substrate, deposited in a layer on the substrate, and/or the like). The first layer 302 and/or the second layer 304 may be silicon-based layers (e.g., with equal thickness, such as 70 μm).

The second layer 304 may include a mirror 308. The mirror 308 may form some or all of the second layer 304 (e.g., the second layer 304 may be shaped, etched, formed, and/or the like to create the mirror 308) or may be a separate layer on top of the second layer 304. The mirror 308 may be coated with a reflective coating (e.g., a metallic reflective material, such as gold) for reflecting optical beams.

In some implementations, a mirror structure 310 may be composed of multiple layers, such as the second layer 304 and/or the mirror 308 (e.g., the mirror structure 310 may include some or all of the second layer 304 and/or the mirror 308). For example, the mirror structure 310 may include the mirror 308; one or more portions of the first layer 302 that does not include a first set of hinges 312, described herein; and/or one or more portions of the second layer 304 that does not include a second set of hinges 314, described herein.

The mirror structure 310 may be suspended (over the first layer 302) via a first set of hinges 312 (e.g., comprising two or more hinges of a first type) and/or a second set of hinges 314 (e.g., comprising two or more hinges of a second type) of the MEMS device 300. The first set of hinges 312 and/or the second set of hinges 314 (e.g., independently and/or in combination) may be configured to tilt the mirror structure 310 (or to allow the mirror structure 310 to tilt) about a first axis (e.g., the x-axis shown in FIG. 3) of the MEMS device 300. For example, the first set of hinges 312 and/or the second set of hinges 314 may be aligned along the first axis of the MEMS device 300 to allow the mirror structure 310 to tilt about the first axis.

In some implementations, the first set of hinges 312 and/or the second set of hinges 314 may be included as part of the second layer 304. In some implementations, the first set of hinges 312 and/or the second set of hinges 314 may be mounted to the first layer 302 via one or more respective anchors 316. Each anchor 316, of the one or more anchors 316, may be included as part of the second layer 304. The one or more anchors 316 may be configured to stabilize the mirror structure 310 as the mirror structure 310 tilts on the first set of hinges 312 and/or the second set of hinges 314 about the first axis (e.g., about the x-axis shown in FIG. 3).

In some implementations, the MEMS device 300 may include one or more comb actuator structures (e.g., a comb actuator structure on each side, in the positive and negative y-directions, of the MEMS device 300 as shown in FIG. 3). A comb actuator structure may be configured to generate an electrostatic torque (also referred to as a driving torque) to tilt the mirror structure 310 about the first axis (e.g., about the x-axis shown in FIG. 3) of the MEMS device 300 on the first set of hinges 312 and/or the second set of hinges 314. Moreover, the comb actuator structure may include one or more comb actuators, such as a stator comb actuator and/or a rotor comb actuator. For example, a comb actuator structure may include a stator comb actuator 322 and/or a rotor comb actuator 324. In some implementations, stator comb actuator 322 may form part of the first layer 302 and/or the rotor comb actuator 324 may form part of the second layer 304.

In some implementations, each of the one or more comb actuators may include a plurality of teeth for engaging with a plurality of teeth of another of the comb actuators. For example, the stator comb actuator 322 may include a plurality of teeth to engage with a plurality of teeth of the rotor comb actuator 324. When a voltage is applied to the stator comb actuator 322, a voltage difference between the rotor comb actuator 324 and the stator comb actuator 322 creates an electrostatic field that causes (e.g., pulls) the plurality of teeth of the rotor comb actuator 324 to engage with the plurality of teeth of the stator comb actuator 322. The electrostatic field may generate a linear electrostatic force (e.g., shown as $F_z$ in FIG. 3) in a direction associated with a second axis (e.g., the z-axis shown in FIG. 3) and/or electrostatic torque (e.g., shown as $T_x$ in FIG. 3) that causes the mirror structure 310 to tilt about the first axis (e.g., about x-axis shown in FIG. 3) on the first set of hinges 312 and/or the second set of hinges 314.

In some implementations, due to one or more misalignments between the plurality of teeth of the rotor comb actuator 324 and the plurality of teeth of the stator comb actuator 322, the electrostatic field may also generate unwanted linear electrostatic force (e.g., shown as $F_x$ in FIG. 3) on the mirror structure 310 in a direction associated with the first axis (e.g., the x-axis) (hereinafter referred to as a "first lateral linear force"). In some implementations, the first set of hinges 312 may include twisting hinges (e.g., two or more twisting hinges) configured to resist the first lateral linear force on the mirror structure 310. For example, as shown in FIG. 3, a hinge 312, of the first set of hinges 312, may be a bar hinge. When a length of a bar of the bar hinge satisfies (e.g., is greater than or equal to) a first bar-length threshold (e.g., that is associated with a particular amount of stiffness, rigidity, and/or the like), the bar hinge is configured to resist the first lateral linear force on the mirror structure 310 in the direction associated with the first axis. For example, the first lateral linear force may act as a compressive force on the bar of the bar hinge, which may be configured, due to the length of the bar being aligned with the first lateral linear force, to prevent the first lateral linear force from moving the mirror structure 310 in the direction associated with the first axis of the MEMS device 300 more than a threshold amount.

Additionally, or alternatively, due to the one or more misalignments between the plurality of teeth of the rotor comb actuator 324 and the plurality of teeth of the stator comb actuator 322, the electrostatic field may also generate unwanted linear electrostatic force (e.g., shown as $F_y$ in FIG. 3) on the mirror structure 310 in a direction associated with the third axis (e.g., the y-axis) (hereinafter referred to as a "second lateral linear force") and/or unwanted electrostatic torque (e.g., shown as $T_z$ in FIG. 3) on the mirror structure 310 about the second axis (e.g., about the z-axis shown in FIG. 3) (hereinafter referred to as "in-plane torque"). In some implementations, the second set of hinges 314 may include twisting hinges (e.g., two or more twisting hinges) configured to resist the second lateral linear force and/or the in-plane torque on the mirror structure 310.

For example, as shown in FIG. 3, a hinge 314, of the second set of hinges 314, may be a serpentine hinge that includes a plurality of bars 318 (e.g., a folded hinge with the plurality of bars 318 arranged side-by-side along a third axis of the MEMS device 300, such as the y-axis shown in FIG. 3). When a length of each bar 318 satisfies (e.g., is less than) a second bar-length threshold (e.g., that is associated with a particular amount of stiffness, rigidity, and/or the like) and/or a sum of the lengths of the plurality of bars 318 satisfies (e.g., is greater than or equal to) a third bar-length threshold (e.g., that is associated with a particular amount of stiffness, rigidity, and/or the like), the serpentine hinge is configured to resist the second lateral linear force on the mirror structure in the direction associated with the third axis and/or the in-plane torque on the mirror structure 310 about the second axis. For example, the second lateral linear force may act as a compressive force on the plurality of bars 318 of the serpentine hinge, which may be configured, due to short lengths of the plurality of bars 318 (e.g., because bending deformation under the second lateral linear force is inversely proportional to a cubic of bar length), to prevent the second lateral linear force from moving the mirror structure 310 in the direction associated with the third axis of the MEMS device 300 more than a threshold amount. As another example, the in-plane torque may act as a bending force on the plurality of bars 318 of the serpentine hinge, which may be configured, due to short lengths of the plurality of bars 318, to prevent the in-plane torque from tilting the mirror structure 310 about the second axis of the MEMS device 300 more than a threshold amount.

In some implementations, a pivot center (e.g., a representative pivot point) of the first set of hinges 312 and the second set of hinges 314 may be aligned with a mass center of the mirror structure 310. In some implementations, the respective pivot points of the first set of hinges 312 and the second set of hinges 314 may be positioned to align with each other and the mass center of the mirror structure 310. In this way, the mass center of the mirror structure 310 may be aligned with the pivot center of the first set of hinges 312 and the second set of hinges 314, which may increase an operational vibration resistance of the mirror structure 310, first set of hinges 312, and/or the second set of hinges 314. Accordingly the mirror structure 310 may resist linear inertial force caused by operational vibration and thereby prevent or reduce induced tilting torque.

As indicated above, FIG. 3 is provided merely as one or more examples. Other examples may differ from what is described with regard to FIG. 3.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, and/or the like, depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A micro-electro-mechanical system (MEMS) device, comprising:
a first layer that includes a set of stator comb actuators;
a second layer that includes a set of rotor comb actuators and a first set of hinges; and
a third layer that includes a second set of hinges, wherein:
the second layer is adjacent to the first layer and the third layer is adjacent to the second layer,
the first set of hinges and the second set of hinges are configured to tilt a mirror structure about a first axis of the MEMS device,
wherein a driving torque to tilt the mirror structure about the first axis of the MEMS device via the first set of hinges and the second set of hinges is caused by a stator comb actuator, of the set of stator comb actuators, engaging with a rotor comb actuator, of the set of rotor comb actuators,
the first set of hinges is configured to resist a lateral linear force on the mirror structure in a direction associated with the first axis caused by the stator comb actuator engaging with the rotor comb actuator, and
the second set of hinges is configured to resist an in-plane torque on the mirror structure about a second axis of the MEMS device caused by the stator comb actuator engaging with the rotor comb actuator.

2. The MEMS device of claim 1, wherein a plurality of teeth of the stator comb actuator are configured to engage with a plurality of teeth of the rotor comb actuator to generate the driving torque to tilt the mirror structure about the first axis via the first set of hinges and the second set of hinges, wherein the lateral linear force and the in-plane torque are generated based on misalignments between the plurality of teeth of the rotor comb actuator and the plurality of teeth of the stator comb actuator when engaged.

3. The MEMS device of claim 1, wherein the mirror structure comprises at least one of:
a mirror;
one or more portions of the second layer that do not include the first set of hinges; or
one or more portions of the third layer that do not include the second set of hinges.

4. The MEMS device of claim 1, wherein the first set of hinges comprise two or more bar hinges and the second set of hinges comprise two or more serpentine hinges.

5. The MEMS device of claim 1, wherein a hinge of the first set of hinges comprises a single bar and a hinge of the second set of hinges comprises a plurality of bars.

6. The MEMS device of claim 1, wherein a pivot center associated with the first set of hinges and the second set of hinges aligns with a mass center of the mirror structure.

7. The MEMS device of claim 1, wherein a pivot center associated with the first set of hinges and the second set of hinges is positioned to resist linear inertial vibration caused by operational vibration associated with operation of the MEMS device.

8. The MEMS device of claim 1, wherein the first set of hinges are anchored to the first layer by a first set of anchors and the second set of hinges are anchored to the first layer by a second set of anchors, wherein:
the first set of anchors form part of the second layer; and
the second set of anchors form part of the second layer and part of the third layer.

9. A micro-electro-mechanical system (MEMS) device, comprising:
a first layer that includes a set of stator comb actuators; and
a second layer that includes a set of rotor comb actuators, a first set of hinges, and a second set of hinges, wherein:
the second layer is adjacent to the first layer,
the first set of hinges and the second set of hinges are configured to tilt a mirror structure about a first axis of the MEMS device based on a driving torque caused by a stator comb actuator, of the set of stator comb actuators, engaging with a rotor comb actuator, of the set of rotor comb actuators,
the first set of hinges is configured to resist a lateral linear force on the mirror structure in a direction associated with the first axis caused by the stator comb actuator engaging with the rotor comb actuator,
the second set of hinges is configured to resist an in-plane torque on the mirror structure about a second axis of the MEMS device caused by the stator comb actuator engaging with the rotor comb actuator,
a pivot center associated with the first set of hinges and the second set of hinges aligns with a mass center of the mirror structure, and a position of the pivot center is based on a ratio of a lateral stiffness associated with the first set of hinges and a lateral stiffness associated with the second set of hinges.

10. The MEMS device of claim 9, wherein a mirror is etched into the second layer or formed as a separate layer on top of the second layer,
wherein the mirror structure includes the mirror and does not include the first set of hinges and the second set of hinges.

11. The MEMs device of claim 9, wherein the second set of hinges include twisting hinges.

12. The MEMS device of claim 9, wherein the second set of hinges is further configured to resist an additional lateral linear force on the mirror structure in a direction associated with a third axis of the MEMS device caused by the stator comb actuator engaging with the rotor comb actuator.

13. The MEMS device of claim 9, wherein the first set of hinges and the second set of hinges are anchored to the first layer by a set of anchors,
wherein the set of anchors form part of the second layer.

14. The MEMS device of claim 9, wherein the first set of hinges include two or more bar hinges that each include a bar that is coaxial with the first axis.

15. A micro-electro-mechanical system (MEMS) device, comprising:
a first layer that includes a stator comb actuator;
a second layer that includes a rotor comb actuator and a first set of hinges;
a third layer that includes a second set of hinges; and
a mirror structure that includes a mirror, wherein:
the first set of hinges and the second set of hinges are configured to tilt the mirror structure about a first axis of the MEMS device based on a driving torque caused by the stator comb actuator engaging with the rotor comb actuator,
the first set of hinges is configured to resist a first lateral linear force on the mirror structure in a first direction associated with the first axis caused by the stator comb actuator engaging with the rotor comb actuator, and
the second set of hinges is configured to resist a second lateral linear force on the mirror structure in a second direction associated with a second axis of the MEMS device caused by the stator comb actuator engaging with the rotor comb actuator.

16. The MEMS device of claim 15, wherein the second set of hinges includes two or more serpentine hinges.

17. The MEMS device of claim 15, wherein a pivot center associated with the first set of hinges and the second set of hinges aligns with a mass center of the mirror structure.

18. The MEMS device of claim 17, wherein a position of the pivot center is based on a ratio of a lateral stiffness associated with the first set of hinges and a lateral stiffness associated with the second set of hinges.

19. The MEMS device of claim 15, wherein the second set of hinges is further configured to resist an in-plane torque on the mirror structure about a third axis of the MEMS device caused by the stator comb actuator engaging with the rotor comb actuator.

20. The MEMS device of claim 15, wherein the first set of hinges include two or more bar hinges that each include a bar that is coaxial with the first axis.

* * * * *